United States Patent
Tu et al.

(10) Patent No.: US 10,665,563 B2
(45) Date of Patent: May 26, 2020

(54) SEMICONDUCTOR CHIP PACKAGING STRUCTURE WITHOUT SOLDERING WIRE, AND PACKAGING METHOD THEREOF

(71) Applicant: SHENZHEN JIEJIANDA INNOVATION TECHNOLOGY CO., LTD., Shenzhen (CN)

(72) Inventors: Bo Tu, Shenzhen (CN); Hsiang-Yi Cheng, Shenzhen (CN)

(73) Assignee: SHENZHEN JIEJIANDA INNOVATION TECHNOLOGY CO., LTD., Nanshan, Shenzhen (CN)

( * ) Notice: Subject to any disclaimer, the term of this patent is extended or adjusted under 35 U.S.C. 154(b) by 0 days.

(21) Appl. No.: 16/134,123

(22) Filed: Sep. 18, 2018

(65) Prior Publication Data
US 2020/0091106 A1    Mar. 19, 2020

(51) Int. Cl.
*H01L 21/00*  (2006.01)
*H01L 23/00*  (2006.01)
*H01L 23/532*  (2006.01)
*H01L 21/02*  (2006.01)

(52) U.S. Cl.
CPC ........ *H01L 24/32* (2013.01); *H01L 21/02422* (2013.01); *H01L 21/02617* (2013.01); *H01L 23/53209* (2013.01)

(58) Field of Classification Search
CPC ............... H01L 24/32; H01L 21/02422; H01L 23/53209
See application file for complete search history.

(56) References Cited

U.S. PATENT DOCUMENTS

| | | | | |
|---|---|---|---|---|
| 4,862,322 A | * | 8/1989 | Bickford | H01L 23/49575 361/718 |
| 5,158,470 A | * | 10/1992 | Zarreii | H01R 12/58 439/751 |
| 5,798,050 A | * | 8/1998 | Gaynes | H01L 23/3733 216/20 |
| 6,326,241 B1 | * | 12/2001 | Belke, Jr. | H01L 21/563 257/E21.503 |
| 2009/0108436 A1 | * | 4/2009 | Fujii | H01L 21/486 257/693 |
| 2019/0035831 A1 | * | 1/2019 | Cao | H01L 27/14661 |
| 2019/0081012 A1 | * | 3/2019 | Wu | H01L 23/60 |

* cited by examiner

*Primary Examiner* — Laura M Menz
(74) *Attorney, Agent, or Firm* — Rosenberg, Klein & Lee

(57) ABSTRACT

A semiconductor chip packaging structure without soldering wire and a packaging method thereof are disclosed. The semiconductor chip packaging structure comprises at least one packaging structure, and each packaging structure comprises a substrate, and a semiconductor chip is arranged on the substrate. Pins of the semiconductor chip are electrically connected to the conductive circuit formed by engraving or etching metal film or alloy film. The semiconductor chip packaging structure also comprises a packaging glue layer covering the semiconductor chip and the conductive circuit. The semiconductor chip packaging method includes steps of arranging a semiconductor chip on the substrate; forming a metal film or an alloy film around the semiconductor chip; etching the metal film or alloy film, to form the conductive circuit; and covering a packaging glue layer on the semiconductor chip and the conductive circuit. As a result, the production efficiency can be improved greatly.

13 Claims, 2 Drawing Sheets

SEMICONDUCTOR CHIP PACKAGING STRUCTURE WITHOUT SOLDERING WIRE, AND PACKAGING METHOD THEREOF

BACKGROUND OF THE INVENTION

1. Field of the Invention

The present invention relates to a chip packaging technical field, and more particularly to a semiconductor chip packaging structure without soldering wire, and a packaging method thereof.

2. Description of the Related Art

In a convention semiconductor chip packaging method, a semiconductor chip is generally fixed on a substrate or a supporter, and soldering pins of the semiconductor chip are soldered with external conductive wires, and the semiconductor chip is sealed; alternatively, the semiconductor chip is flipped to mount and fix on the substrate or the supporter, and silk print process is performed to coat solder paste on the substrate or the supporter, and reflow soldering and sealing processes are then performed. Generally, the conventional semiconductor chip packaging methods also include DIP, PLCC, SOP, CSP, and so on; and, LED chip packaging methods include in-line packaging, SMD, COB, CSP, and so on.

However, the soldering equipment used on the conventional semiconductor chip packaging method has high cost, and, the material of the solder wires is also expensive; and, burned solder ball has high temperature, and pressure and others parameters cannot not easy to control during the conventional packaging process, so it causes the low yield of packaged products, and the solder pad may be damaged easily. Furthermore, the process of soldering wires may cause long packaging time, and low production efficiency. However, the flip chip packaging method also requires silk print process for coating solder paste and also suffer from high material cost, high reflow soldering temperature, complicated control scheme, and the process of producing gold silver and tin eutectic alloy or gold and tin eutectic alloy is not easy to control, and the packaging material may be damaged under high temperature.

SUMMARY OF THE INVENTION

An objective of the present invention is to provide a semiconductor chip packaging structure without soldering wire and a packaging method thereof, so as to solve the problems that the wire soldering equipment cost is high, the material of the solder wires is also expensive, the burned solder ball has high temperature, and pressure and others parameter is not easy to control, and these problems may cause low yield of the packaged products, and the solder pad may be damaged easily, and the process of soldering wires also cause long packaging time and low production efficiency.

In order to solve above-mentioned technical problems, the present invention provides a technical solution. In the technical solution, a semiconductor chip packaging structure comprises at least one packaging structure including a substrate, and a semiconductor chip is arranged on the substrate, and pins of the semiconductor chip are electrically connected to the conductive circuit formed by engraving or etching a metal film or an alloy film; and, the semiconductor chip packaging structure also comprises a packaging glue layer configured to cover the semiconductor chip and the conductive circuit.

According to an embodiment of the present invention, the metal film or the alloy film is formed by vacuum vapor deposition, a magnetically-controlled sputtering, a continuous plating, a water plating or a chemical plating.

According to an embodiment of the present invention, the conductive circuit is formed by laser engraving.

According to an embodiment of the present invention, the packaging glue layer is cured by electromagnetic wave.

According to an embodiment of the present invention, the substrate is made by glass, plastic, or ceramic, and the packaging structure is a packaging structure having one of two to ninety-six layers.

In order to solve above-mentioned technical problem, the present invention provides a semiconductor chip packaging method without soldering wire, and the method comprise following steps.

In a step A1, a semiconductor chip is arranged on the substrate.

In a step A2, a metal film or an alloy film is formed around the semiconductor chip.

In a step A3, the metal film or the alloy film is engraved or etched to form a conductive circuit.

In a step A4, a packaging glue layer is covered on the semiconductor chip and the conductive circuit.

According to an embodiment of the present invention, the metal film or the alloy film is formed by vacuum vapor deposition, a magnetically-controlled sputtering, a continuous plating, a water plating or a chemical plating.

According to an embodiment of the present invention, the conductive circuit is formed by laser engraving.

According to an embodiment of the present invention, the packaging glue layer is cured by electromagnetic wave.

According to an embodiment of the present invention, the substrate is made by glass, plastic, or ceramic.

According to above-mentioned content, the metal film or the alloy film used in the present invention can be formed by vacuum vapor deposition or sputtering under a room temperature, or by water plating or chemical plating, and there are various platings applicable to form the metal film or the alloy film; in the present invention, the metal film or the alloy film can be engraved or etched to form the electrically-conductive and thermally-conductive circuit without wire soldering process, and the engraving or etching can form the circuit integrally and very quickly, so as to greatly improve production efficiency. In the packaging structure of the present invention, multiple packaging structures can be stacked by the same process, so the semiconductor chip packaging process can be greatly improved. The technical solution of the present invention has low requirement for equipment, and the existing China machine suppliers can provide the equipment, so the user can apply the technical solution of the present invention without additional research and development. During the packing process of the present invention, the solder pad is not applied by vertical force, so the solder pad is not damaged and the thermal expansion force packaging structure of the present invention can achieve balance, and the resistance of the packaging structure to cold and heat can be significantly improved.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

Figure 1:
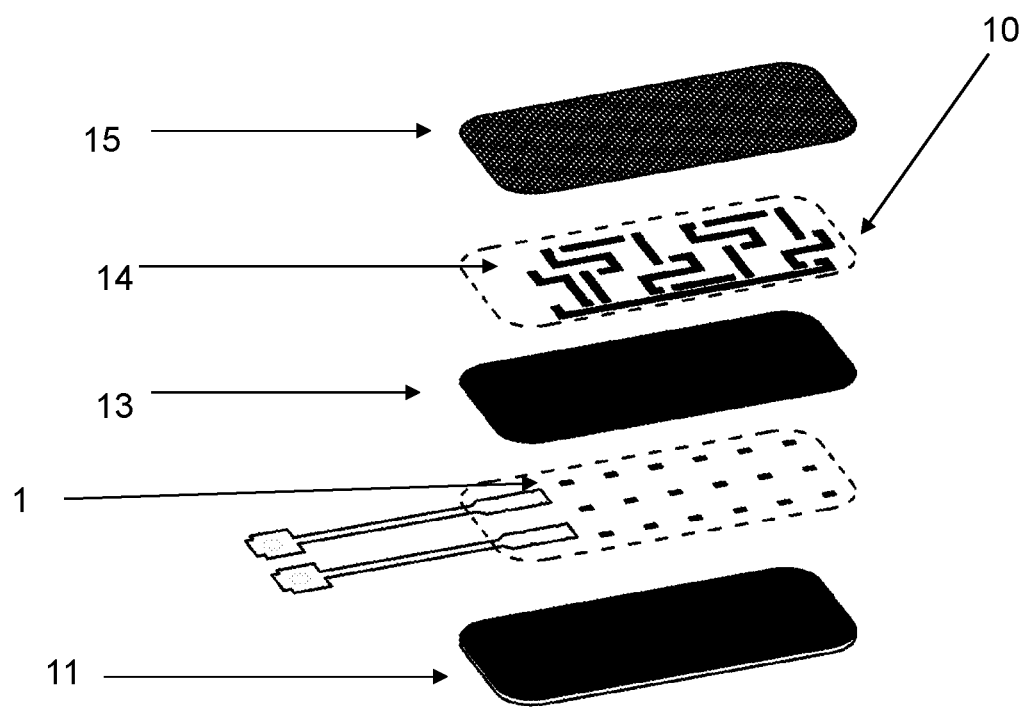
FIG. 1 is a schematic view of a semiconductor chip packaging structure of the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the term "or" includes any and all combinations of one or more of the associated listed items.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise" and variations such as "comprises" or "comprising", will be understood to imply the inclusion of stated elements but not the exclusion of any other elements.

As shown in FIG. 1, the semiconductor chip packaging structure includes at least one packaging structure 10, and each packaging structure 10 includes a substrate 11, and a semiconductor chip 12 arranged on the substrate 11. Pins of the semiconductor chip 12 are electrically connected to the conductive circuit formed by engraving or etching a metal film or an alloy film 13. The semiconductor chip packaging structure also comprises a packaging glue layer 15 configured to cover the semiconductor chip 12 and the conductive circuit 14. According to an embodiment of the present invention, the metal film or the alloy film 13 can be formed by vacuum vapor deposition, a magnetically-controlled sputtering, a continuous plating, a water plating, or a chemical plating. The conductive circuit 14 can be formed by laser engraving. The packaging glue layer 15 can be cured by electromagnetic wave. Preferably, the substrate 11 can be made by glass, plastic, or ceramic, and the packaging structure 10 can be a packaging structure having one of two to ninety-six layers.

Figure 2:
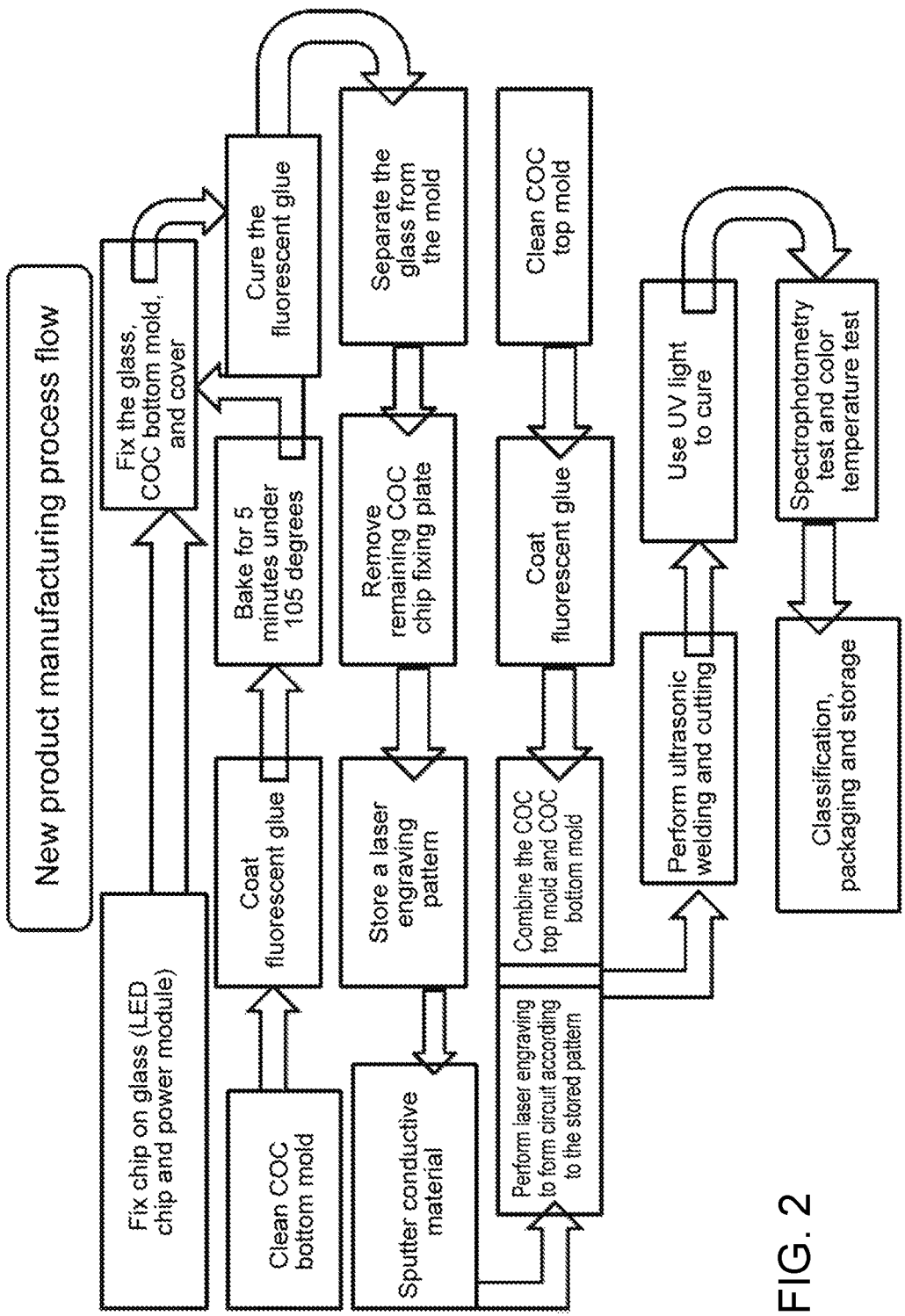
FIG. 2 is a flowchart of an embodiment of a semiconductor chip packaging method of the present invention.

As shown in FIG. 2, the semiconductor chip packaging method of the present invention can comprise steps A1 to A4.

In step A1, a semiconductor chip is arranged on the substrate.

In step A2, the metal film or the alloy film is formed around the semiconductor chip.

In step A3, the metal film or alloy film is engraved or etched to form the conductive circuit.

In step A4, a packaging glue layer is covered on the semiconductor chip and the conductive circuit.

According to an embodiment of the present invention, the metal film or the alloy film can be formed by vacuum vapor deposition, a magnetically-controlled sputtering, a continuous plating, a water plating, or a chemical plating. The conductive circuit can be formed by laser engraving. The packaging glue layer can be cured by electromagnetic wave. The substrate can be made by glass, plastic, or ceramic.

The semiconductor chip packaging technology of the present invention is a unique semiconductor packaging technology which does not need base plate, solder paste, solder wire, reflow soldering process and reflow soldering oven, in the world.

Compared with the conventional semiconductor chip packaging technology, the semiconductor chip packaging technology of the present invention has advantages below.

The first advantage is to have no need for the base plate, so as to achieve effects of time cost reduction and even chip fixing glue reduction.

The second advantage is to have no need for solder wire, so as to achieve effects of lowering operation cycle to save time, and improving yield and reliability.

The third advantage is to have no need for solder paste, so as to achieve effects of not polluting environment, and reducing operation steps.

The fourth advantage is to have no need for reflow soldering process, so as to prevent high-temperature step, and further save energy, and protect the packaging glue from being damaged.

The fifth advantage is to have no need for oven, the glue of the present invention can be cured by electromagnetic wave, to save time and reduce power consumption, so that automation of the whole process can be improved.

The plating machine and technology, such as vacuum vapor deposition, magnetically-controlled sputtering, water plating, chemical plating, are developed maturely in China are easily available in market and can be used in the present invention; furthermore, the user can use localized machines to implement the technical solution of the present invention without being subject to foreign countries. The technical solution of the present invention can use the self-developed material and technology, and use electromagnetic wave to cure glue, so as to reduce power consumption and time cost of production, and further significantly lower site and manpower cost, and improve reliability and production capacity. The technical solution of the present invention is a zero release and full recycling technology, and no waste water, no waste gas, no waste acid, no waste alkali is produced during the production process, and the processes are performed under room temperature. The process without producing waste heat can greatly save energy and material. It can be said that the technical solution of the present invention is a model of green environmental protection. All materials used in the present invention can be recycled for reuse. The present invention can improve performance of packaged product.

In order to prevent from polluting living environment, the technical solution of the present invention is developed in overall consideration of product architecture, material, machine and process for semiconductor chip packaging technology and LED packaging structure, to achieve the purpose of reducing power consumption, site and time cost, and improving automation, so that the technical solution of the present invention can be more competitive in global market.

In a basis of plating the metal film or alloy film, the sputtering surface of the semiconductor chip or the LED is planarized by using a mold, to reduce a flatness error of the sputtering surface to below 10 µm. In an embodiment, vacuum vapor deposition, magnetically-controlled sputtering, continuous plating, water plating, or chemical plating can be used to plate one or more metal layer or alloy layer on the gluing surface and the chip, so as to form transparent or non-transparent conductive wires. A mask can be used to perform plating again, or etching process is performed after the plating process, or, an engraving process is performed to remove undesired conductive wire after the plating process, so as to form various circuits. Next, protection structures are formed for protecting the chip and conductive wires; and, after the packaging process, the cutting process, spectrophotometry test, logic test are performed on the packaged products, and the packaged products are then appropriately classified. The final products are delivered after packaging, storage, quality assurance, and test processes.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A semiconductor chip packaging structure without soldering wires, comprising:
    at least one packaging structure comprising a substrate;
    a semiconductor chip arranged on the substrate, wherein pins of the semiconductor chip are directly electrically connected to a patterned conductive circuit around the semiconductor chip without soldering wires, the patterned conductive circuit formed by engraving or etching a metal film or an alloy film, and the patterned conductive circuit is arranged on the substrate; and
    a packaging glue layer covering the semiconductor chip and the patterned conductive circuit, and the semiconductor chip and the patterned conductive circuit are formed between the packaging glue layer and the substrate.

2. The packaging structure according to claim 1, wherein the metal film or the alloy film is formed by vacuum vapor deposition, magnetically-controlled sputtering, continuous plating, water plating, or chemical plating.

3. The packaging structure according to claim 1, wherein the patterned conductive circuit is formed by laser engraving.

4. The packaging structure according to claim 1, wherein the packaging glue layer is cured by electromagnetic wave.

5. The packaging structure according to claim 1, wherein the substrate is made by glass, plastic, or ceramic, and the packaging structure is a packaging structure having one of two to ninety-six layers.

6. The packaging structure according to claim 2, wherein the substrate is made by glass, plastic, or ceramic, and the packaging structure is a packaging structure having one of two to ninety-six layers.

7. The packaging structure according to claim 3, wherein the substrate is made by glass, plastic, or ceramic, and the packaging structure is a packaging structure having one of two to ninety-six layers.

8. The packaging structure according to claim 4, wherein the substrate is made by glass, plastic, or ceramic, and the packaging structure is a packaging structure having one of two to ninety-six layers.

9. A semiconductor chip packaging method without soldering wires, comprising:
    (A1) arranging a semiconductor chip on a substrate;
    (A2) providing a metal film or an alloy film around the semiconductor chip, and the metal film or the alloy film is arranged on the substrate and directly electrically connected to pins of the semiconductor chip without soldering wires;
    (A3) engraving or etching the metal film or the alloy film to form a patterned conductive circuit; and
    (A4) covering a packaging glue layer on the semiconductor chip and the patterned conductive circuit, and the semiconductor chip and the patterned conductive circuit are formed between the packaging glue layer and the substrate.

10. The semiconductor chip packaging method according to claim 6, wherein the metal film or the alloy film is formed by vacuum vapor deposition, magnetically-controlled sputtering, continuous plating, water plating, or chemical plating.

11. The semiconductor chip packaging method according to claim 7, wherein the patterned conductive circuit is formed by laser engraving.

12. The semiconductor chip packaging method according to claim 8, wherein the packaging glue layer is cured by electromagnetic wave.

13. The semiconductor chip packaging method according to claim 9, wherein the substrate is made by glass, plastic or ceramic.

* * * * *